United States Patent [19]
Pforr et al.

[11] Patent Number: 5,496,669
[45] Date of Patent: Mar. 5, 1996

[54] SYSTEM FOR DETECTING A LATENT IMAGE USING AN ALIGNMENT APPARATUS

[75] Inventors: Rainer Pforr, Wilsele, Belgium; Steve Wittekoek, Bergeyk, Netherlands; Rolf Seltmann, Dresden, Germany

[73] Assignee: Interuniversitair Micro-Elektronica Centrum vzw, Leuven, Belgium

[21] Appl. No.: 204,137
[22] PCT Filed: Jul. 1, 1993
[86] PCT No.: PCT/BE93/00046
   § 371 Date: Jun. 27, 1994
   § 102(e) Date: Jun. 27, 1994
[87] PCT Pub. No.: WO94/01808
   PCT Pub. Date: Jan. 20, 1994

[30] Foreign Application Priority Data

Jul. 1, 1992 [BE] Belgium ................... 09200611

[51] Int. Cl.⁶ ................................... G03F 9/00
[52] U.S. Cl. .................. 430/22; 430/30; 430/394; 356/123; 356/372; 356/394
[58] Field of Search ................. 430/22, 30, 394; 356/123, 372, 394

[56] References Cited

U.S. PATENT DOCUMENTS 5,124,927  6/1992  Hopewell et al. .............. 364/468

Primary Examiner—S. Rosasco
Attorney, Agent, or Firm—Levine & Mandelbaum

[57] ABSTRACT

The system comprises a latent image detection device comprising an alignment device which uses non-actinic radiation (10) and which is intended for aligning the mask pattern with respect to the substrate (3) and is designed for detecting the measure of coincidence of a mask alignment feature and a substrate alignment feature (8). The alignment device is provided with a radiation-sensitive detection system (6) which is connected to an electronic signal circuit in which the amplitude of the radiation incident on the detection system is determined, which originates from a latent image, formed in the photosensitive layer, of a mask feature, in which a spatial frequency occurs which is approximately equal to the useful resolving power of the projection lens system and considerably greater than the resolving power of the alignment device.

19 Claims, 2 Drawing Sheets

31

31

32

31

SYSTEM FOR DETECTING A LATENT IMAGE USING AN ALIGNMENT APPARATUS

FIELD OF THE INVENTION

This invention relates to an optical system for forming an image of a mask pattern in photolithography and especially to a device for determining the image plane with maximum sharpness in a system of this type.

DESCRIPTION OF THE PRIOR ART

Technical development in past years has shown that the boundaries in respect of the efficiency of photolithography are still evolving. Hitherto, inter alia x-ray, electron and ion lithography have been used to meet the demands of mass production of integrated semiconductor devices. In recent mass production developments, half-micron structures have been fabricated by means of the application of so-called wafer steppers which transfer the contents of a conventional chromium mask by means of protection objectives whose numerical aperture, hereinafter indicated as NA, is within the range of 0.45 and 0.56, and ultraviolet light having a wavelength of 365 nm. A so-called global alignment was used for improving the accuracy of the mutual superposition between various masks with a direct mutual coverage between a so-called mask feature or mask marker and wafer marker. In the process, optical filtering takes place of the optical signals which are generated upon exposure of the wafer by means of light from the alignment detection system.

In order to achieve a further decrease of the structure width, a still further increase of the NA and a further decrease of the wavelength in the UV region has been considered. This would, however, result in a considerable reduction of the sharpness. Nor can this situation be significantly altered by improving the image by means of phase-shifting or exposure methods.

In order to be able to apply said new technical possibilities of further structure refinements successfully in mass production, a further reduction is required of lithographic parameters such as overlay faults and fluctuations of the line widths on wafers being processed. These are primarily determined by fluctuations of the energy injected into the photographic material or resist, and thus in particular the unsharpness of the image, such as the defocusing of the aerial image in the resist. As a result, the decrease in the influence of technical parameters on the position of the aerial image having optimum sharpness in the resist (defocusing) is becoming increasingly important. Therefore, attempts were made to determine and to correct, by means of a latent image, the optimum position of the aerial image in the resist as well as the position-dependent fluctuations of the injected energy.

In a publication "SPIE, part 1464" on "Integrated Circuit Metrology, Inspection and Process Control V(1991), pp. 245 to 257 inclusive, and pp. 294 et seq", measuring devices having a projection system are described which are based on the absorption of the light which is diffracted from the latent image of a grid which has equidistant lines and grooves and an image of which is formed in the resist upon exposure to non-actinic light. This can be used to draw inferences with respect to the position of the focus, and photolithographic and image parameters of the projection system can be determined. A grid is generated by forming the image of a matching mask structure, by means of a so-called stepper, in the resist which is located on a wafer. For the purpose of recording light diffracted by the image of the grid, objectives having a relatively high NA can be used without having to satisfy oversevere constraints with respect to optical defects. Consequently, strong measured signals were obtained, even for extremely small changes in the absorption of the resist and in its refractive index. A first drawback in this case is that an additional device is required which means additional cost. A further drawback is that the desired information, such as optimum focus position, is obtained after a considerable delay and that said device can only be used on test wafers. Thus said device does not permit technically desirable checks on-line and in situ, nor, consequently, direct measurements and control of the exposure parameters on the production wafer.

In a further part 1261 of the document mentioned, "SPIE, pp. 286 to 297 inclusive", techniques are described in which a multiple image of an alignment marker, such as a groove, is first formed stepwise for various degrees of defocusing in a resist layer. The reflective power of the resulting latent image of the groove is measured by means of the alignment system and compared for various degrees of defocusing. In this case, the alignment system consists of a photometric measuring system. The focus setting at which the strongest photometric contrast is generated, is defined as the optimum substrate height (or focus). Thus, the measuring system used in the stepper for alignment can also be used for reflection angle measurements. Consequently, additional devices are not required in this case. The drawbacks here, however, lie in the fact that the superposition system operates with actinic light. Conventional resists indeed show a considerable fundamental or basic absorption for actinic light. As a result, the optical signal reflected by the semiconductor substrate, and thus the measured signal, are weak. The measuring time is long, however, and the measuring accuracy is low. In practice, this technique can be used only for test wafers of selected quality. Moreover, it requires stringent monitoring of the layer thicknesses of the resist and of the so-called technological layers, i.e. the areas having maximum reflection.

Furthermore, the use of said device in semiconductor technology is made more difficult by the increasingly extensive technological modifications which come with a further reduction of the structure width. This is the case, inter alia, when colouring the resist, when using anti-reflective layers in order to suppress interference effects, or when employing contrast-enhancing layers. The increasing complexity of the device does therefore usually result in a defect. Furthermore, in situ checks of the focus on production wafers are virtually impossible.

Wafer steppers having modern alignment systems are described in an article by S. Wittekoek, J. v.d. Werf and R. A. George and presented at the SPIE symposium on optical microlithography IV in Santa Clara, Calif., Mar. 10–15th 1985. They work on the basis of filtering techniques of signals which originate from alignment markers. A comparable method using the light of the prior art cannot be used in these wafer steppers. If defocused images are formed in a stepwise manner of the alignment markers specified in the steppers described, only weak and randomly fluctuating values are obtained when measuring the intensity of the alignment signal. These values do not permit any inference with respect to the relevant setting of the height of the substrate in the case of exposure of the markers. The reason for this is that the superposition markers and the alignment system are designed in such a way that defocusing of the markers during exposure or during alignment will have as small an effect as possible on the signals detected and thus on the alignment accuracy. If grids are used having a positional frequency which is higher than that of the alignment markers, virtually no superposition signal is obtained. This is due to the fact that the waves diffracted by said structure are filtered out by an edge filter positioned in the image beam path of the optical alignment device. This type of alignment device having a grid-like structure with a low positional frequency is used for optical filtering techniques to extract the superposition signals. So far, however, no technical solution had been found for such an alignment device in terms of on-line or in situ determination of the optimum height of the substrate or of the tilt of the plane having optimum image sharpness with respect to the substrate surface.

The object of the invention is to present a solution which overcomes the abovementioned drawbacks. According to this invention, a projection device is therefore provided whose alignment system uses an optical filtering device and grid-shaped alignment markers.

SUMMARY OF THE INVENTION

A system is presented for forming an image, by means of projection radiation, of a mask feature in a photosensitive layer on a substrate, which system is provided with a mask holder, a substrate holder, a projection lens system placed between the mask holder and the substrate holder, and a latent-image detection device for carrying out measurements on an undeveloped image, formed by means of the projection light, of a mask feature in the photosensitive layer. The latent-image detection device comprises an alignment device which uses non-actinic radiation and which is intended for aligning, via the projection lens system, the mask feature or mask pattern with respect to the substrate and is designed for detecting the measure of coincidence of a mask alignment feature and a substrate alignment feature. The alignment device is provided with a radiation-sensitive detection system which is connected to an electronic signal processing circuit in which, for the purpose of latent-image detection, the amplitude of the radiation incident on the detection system is determined, which comes from a latent image, formed in the photosensitive layer, of a mask feature, in which a spatial frequency occurs which is approximately equal to the useful resolving power of the projection lens system and considerably greater than the resolving power of the alignment device.

In a particular embodiment of the invention, it is provided that the mask alignment feature is a raster and the substrate alignment feature is a phase raster, that only radiation deflected in the first order by one of the raster features reaches the detection system of the alignment device, and that the image formed in the photosensitive layer has a raster structure with a raster period which results from the superimposition of that of the substrate alignment feature and a period which approximately corresponds to the resolving power of the projection lens system. The alignment device for instance comprises a first-order diaphgragm which transmits, to the radiation-sensitive detection system, only radiation deflected in the first order by one of the raster features.

According to a further embodiment of the invention, the latent-image detection device comprises at least one marker composed of substructures.

For instance, the marker is formed by a grid composed of an arrangement of subfigures, e.g. a periodical arrangement of subfigures.

In a particular embodiment, the marker comprises two rectangular grids having respective positional frequencies which are of the order of magnitude of the separable limit positional frequencies and have a difference which corresponds to the fundamental positional frequency of the grid which is used for the alignment.

According to a further embodiment of the device of the invention, the structures of the base alignment structure are formed by an alternation of analogous elements, in particular of equidistant bars and grooves of which said rectangular grid is composed.

According to yet a further embodiment of the device, this is split up in such a way that said alternation of analog elements is formed by draughtboard-like elements and rectangular grid figures, respectively.

The device according to the invention therefore permits a so-called "on-line and in situ" determination of the substrate height with maximum image contrast. This invention is based on the insight that an alignment system which has proved to work very accurately and reliably in practice, but which was designed for detecting alignment rasters having a spatial frequency which is considerably smaller than the resolving power of the projection lens system, and is therefore less suitable for, for example, measuring the optimum position of the image plane of the projection lens system with respect to the photosensitive layer on the substrate, can nevertheless be made suitable for this purpose. To this end, use is made of an additional mask feature having a spatial frequency which is the superimposition of a frequency corresponding approximately to the useful resolving power of the projection lens system and a frequency which approximately corresponds to the resolving power of the alignment system, and the amplitude of the detector signals is determined in the system instead of the zero crossings of said signals.

Alternatively, other features can be used instead of raster features, if said features are provided with details to which the abovementioned spatial frequencies can be assigned.

Another use of the invention, apart from that of determining an optimum image plane position, is that of determining the optimum dose of projection radiation. In addition, the invention can be used for measuring aberrations of the projection lens system, such as, for example, image field curvature, astigmatism and image tilt. In order to measure these deviations, a plurality of latent images of the mask feature have to be formed at various positions in the photosensitive layer.

This invention further relates to the use of the device described hereinbefore. In use, an image is formed of said at least one by means of said projector by the radiation coming from said first radiation source, the radiation coming from said second radiation source is made to be incident on the fine figures in a photosensitive layer and the intensity of the diffracted radiation is determined by means of the optoelectronic device.

The present invention furthermore also relates to a method for forming the image of a mask pattern and a photosensitive layer on a substrate. Use is made of a mask feature in which a spatial frequency occurs which is approximately equal to the useful resolving power of the projection lens system and considerably greater than the resolving power of the measuring device, and said mask is disposed above the photosensitive layer. An image is formed of the mask feature in the photosensitive layer with the aid of a projection lens system and by means of projection radiation having a first wavelength. The exposed portion of the photosensitive layer is moved into the beam path of an optical measuring device which uses the radiation of a second wavelength to which the photosensitive layer is insensitive. The latent image in the photosensitive layer of the mask feature is detected by means of the measuring device, the amplitude of the measured signal being a function of the contrast of the latent image. An instantaneous value of an image parameter represented by the measured signal supplied by the measuring device is compared with a desired value of said parameter, the image parameter mentioned is set, and an image is formed of the mask pattern on at least one position in the photosensitive layer.

Further advantages and particulars will become apparent from the more detailed description following hereinafter.

DESCRIPTION OF EXEMPLARY EMBODIMENTS

Figure 1:
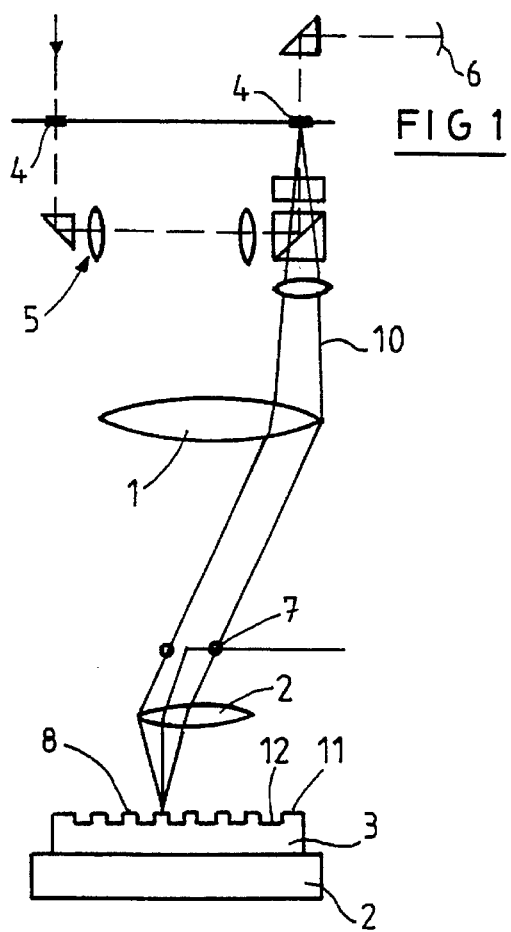
FIG. 1 is a diagrammatic representation of an alignment system in a wafer stepper.

FIG. 1 shows in diagrammatic form an optical system in which a wafer to be processed has been accommodated, with a wafer stepper. The optical system comprises a set of lenses which are arranged in the beam path of an incident radiation, for example a light beam 10. The incident radiation 10 is designed to impinge on, via the lenses 1, 2, the wafer 3 positioned downstream thereof (in a selective manner). The wafer 3 consists of, for example, a conventional silicon substrate and is mounted on a carrier 2 on which it rests with its bottom surface. The top surface of the wafer 3 has a certain configuration consisting of an arrangement of alternately projecting ribs and interposed slots. The configuration depends on the optical system, in particular on masks 4 disposed at the input of the optical system. The masks have a configuration which is transferred by said light beam 10 via the optical system to the top surface of the wafer 3. Further relevant details will be described later herein. Part of the emitted radiation 10 is reflected, upon impinging on wafer 3, by the latter according to a fan of diffraction angles. In addition, a detection device, in particular detection electronics, is provided for measuring the alignment signals. In the beam path of the returning radiation there is provided at least one first-order diaphragm 7 for eliminating unwanted frequencies of the reflected radiation diffracted at the alignment markers.

Moreover, on the top surface of the wafer 3 there is provided at least one alignment feature or alignment marker 8. Said at least one alignment marker consists, for example, of two phase grids disposed in said silicon substrate of the wafer 3. Said phase grids consist, for example, of a succession of virtually equidistant ribs 11 and slots 12 having a fundamental positional frequency of, for example, 62.5 mm$^{-1}$ and 56.82 mm$^{-1}$. The NA of the lens is 0.50 for an exposure wavelength of 365 nm. In addition, matched exposure optics 5 are provided which are arranged in the optical system in such a way that the radiation coupled thereby, for example non-actinic light having a wavelength of 633 nm, is incident at right angles to the marker 8. At the grid, the last-mentioned radiation undergoes diffraction. This gives rise to said fan of waves A±n, where n=0, . . . , N. The waves leave the marker at an angle $\beta_n$, and pass through the lenses 1, represented diagrammatically in FIG. 1 by one single lens for the sake of simplicity. Subsequently, the higher-order waves $A_n$, with the exception of the first order, are eliminated after passing through the diaphragms 7 present in the objective. A radiation distribution is produced in the mask plane as a result of an image being formed of the wafer marker grid in the mask marker grid with matching positional frequency. Said radiation distribution is scanned in the wafer plane by means of a lateral translation of the wafer 3 with respect to the scanning window of the superposition measuring system. The modulation of the transferred radiation behind the mask marker as a function of the wafer location coordinates is then measured using said detection electronics 6. The coincident position is defined, with relation to the coordinates, by the condition that the transferred radiation which, according to the measurements, have different local frequencies for the two grids, must be identical and virtually zero. The modulation of the radiation passing through the mask grid marker is measured during the lateral displacement or translation of the wafer marker. In this case the radiation is a measure for the intensity of the diffracted waves of order 1. Said radiation is thus the relevant measured quantity which is applied hereinafter to obtain the solution according to the invention.

In the following, it is described how the image plane is determined in the resist with maximum sharpness. This effectively means determining the optimum substrate height on the optical axis of the optical system represented in FIG. 1.

Images of the image plane measuring structure (IPMS) are formed stepwise on the substrate 3 which is covered with a photosensitive layer, for example a photoresist. This is done while varying the substrate height along the optical axis. If preferred, it can also be done by arranging for changes in the exposure. This results in a change of the optical properties of the resist, the absorption and, in particular, the refractive index. Subsequently, it is also possible to provide, in addition, chemical means for chemical processing in order to enhance the optical modifications.

Substrate 3 then undergoes a stepwise displacement which is such that the image plane measuring structure arrives at the zone of the scanning window of the alignment device. In addition, a displacement takes place of the image plane measuring structure in the scanning window, combined with a simultaneous measurement of the modulation of the radiation which passes through the mask marker 4, by means of the detection device 6. Said modulation is then recorded and stored in a memory of the stepper, and values thereof are appended to the substrate height on the optical axis.

Thereafter, well known so-called curve fitting methods are applied to the measured functional dependence SS ($\Delta Z$), where $\Delta Z$=substrate height displacement, via second-order polynomials. The substrate height $\Delta Z_f$ corresponding to the extreme value of SS is then calculated as a function of the design of the image plane measuring structure. This extreme value represents that point of the substrate height for which the optimum sharpness of the aerial image is obtained in the resist. Said extreme value represents, with respect to the maximum sharpness of the latent image in the resist, a defined measure which can be appended accurately to the optimum lithographic focus.

Figure 2:
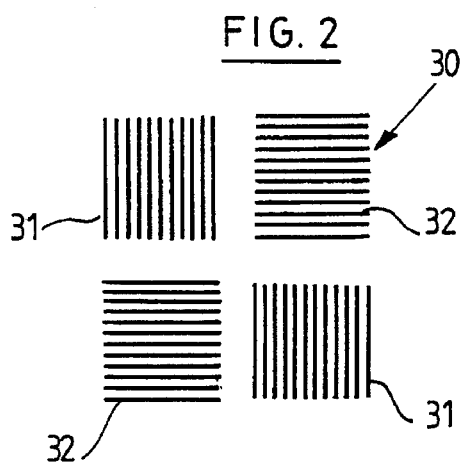
FIG. 2 is a diagrammatic representation of an image plane measuring structure according to the invention.

FIG. 2 represents an image plane measuring structure according to the invention. In addition, the, for example, square surface of a measuring structure of an image plane IPMS 30 is represented diagrammatically. According to the invention, this is subdivided into at least two substructures 31 and 32. Both substructures are, for example, likewise square and differ from each other only by a geometric proportional factor. Consequently, one single substructure is described hereinafter in a more detailed manner, as it appears on the mask.

A representation of such a substructure is represented in FIGS. 3 and 6 to 9 inclusive. Each substructure is further subdivided, according to the invention, into portion substructures. The arrangement of the portion substructures 311, 312 preferably matches, in terms of period, the fundamental positional frequency fo. For example, each period in this instance is composed of strips which extend in parallel with respect to one of the sides of the substructure 31, and according to a number which preferably matches the number of ribs and slots of the fundamental grid. In the example of the figure, the strip width of the portion substructures 311 and 312 is different. Their ratio, however, can be chosen freely.

Figure 4:
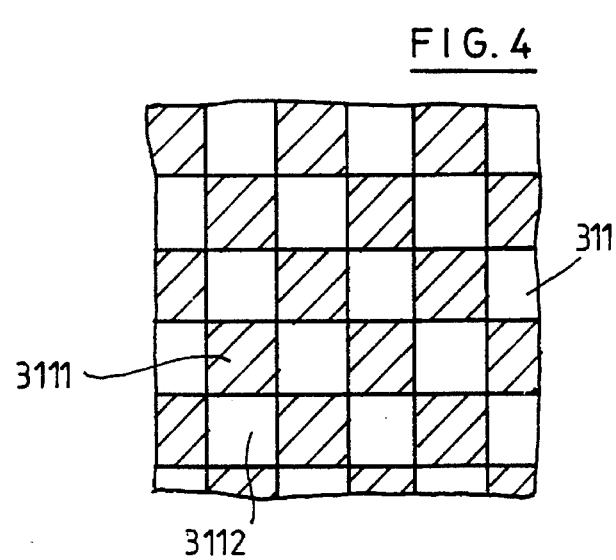
FIG. 4 is a detailed view of a part of FIG. 3.
Figure 3:
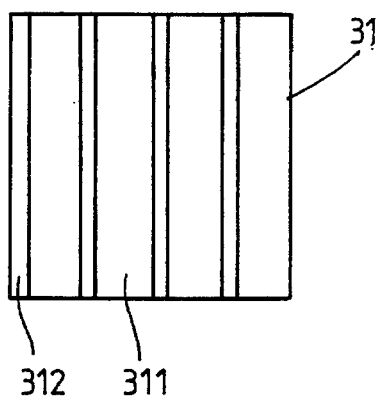
FIG. 3 is a diagrammatic representation of a first embodiment of a substructure of the image plane.
Figure 5:
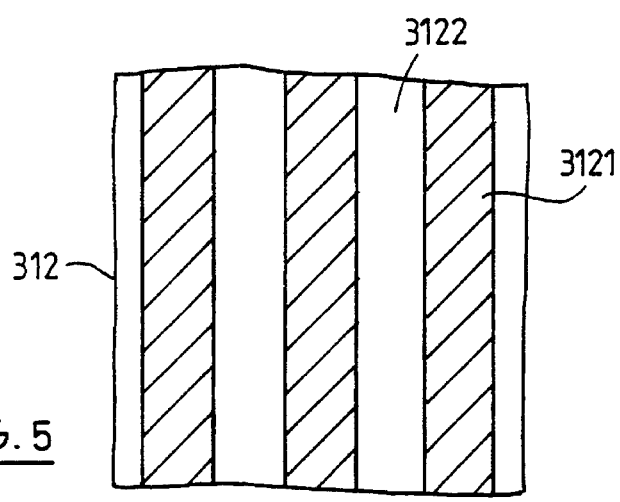
FIG. 5 is a detailed view of a further part of FIG. 3.

A detailed view of FIGS. 4 and 5 shows how the portion substructures 311, 312 in their turn are further subdivided into fine FIGS. 3111, 3112, 3121, 3122. Said fine figures have, for example, a strip shape or a rectangular shape. Other geometrical shapes are also possible, though. The essential aspect in these fine figures according to the invention, however, resides in the fact that the fine figures of at least one portion substructure 311 or 312 have dimensions which are of the order of magnitude of the resolution limit of the projection system. It is provided, according to the invention, that (in the extreme case) an arrangement of fine figures can consist of a periodical grid having a positional frequency zero. In the detailed view of FIG. 4, the portion substructures 311 show, for example, a draughtboard configuration, consisting of transparent and opaque, for example chromium-covered, squares 3111 and 3112, respectively. The size of the squares 3111 is in the range of, for example, between 0.3 and $1 \times \mu/NA$, in this case, for example, $0.55 \times (\mu/NA)$.

Alternatively, the substructures 312 consist of rectangular grids having equidistant ribs and slots having a positional frequency of the order of magnitude of, for example, 1000 $mm^{-1}$. The width of the various substructures is preferably approximately 8 µm, and their length is at least as large as the fundamental alignment structure 8.

It is also possible to use, instead of one single grid as a fine structure in a substructure, several grids having different positional frequencies. In this case, the substructures 31 are subdivided according to two directions. In other words, in addition to a division at right angles to the ribs and slots of the fundamental grid there is, at least for a set of substructures, a further subdivision parallel to the ribs and slots. In an illustrated example, three rectangular grids are provided as a fine structure, which have a positional frequency within the range between 1000 and 1500 $mm^{-1}$.

Furthermore, it is also possible to provide, instead of a draughtboard configuration as the fine structure of the substructure 311, a grid having a positional frequency of 2000 $mm^{-1}$, in which an arrangement of the ribs at right angles to the ribs of the fundamental grid 8 is provided. It is provided, for this embodiment of the measuring structure of the image plane IPMS, that the irradiation of the image plane measuring structure for one image height preferably takes place in at least two steps, each using half the nominal irradiation dose. In doing so, the wafer is transferred parallel to the ribs of the fundamental grid 8 in such a way that, during the second irradiation, the areas of the fine structure 312 not irradiated during the first irradiation will preferably now be irradiated.

Figure 6:
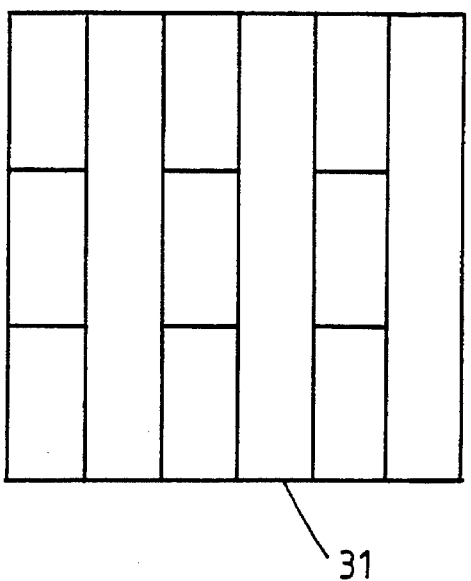
FIG. 6 is a diagrammatic representation of a second embodiment of a substructure of the image plane.
Figure 7:
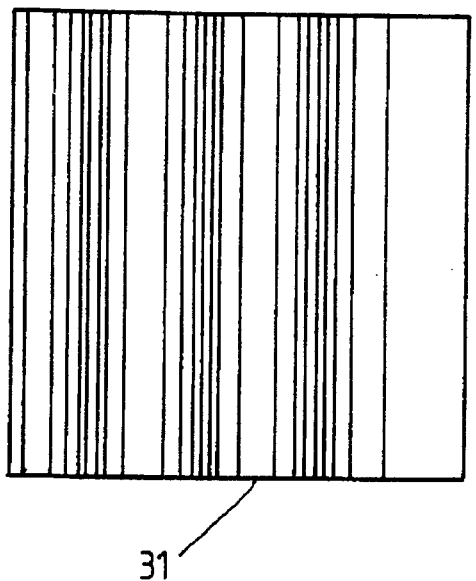
FIG. 7 is a diagrammatic representation of a third embodiment of a substructure of the image plane.
Figure 8:
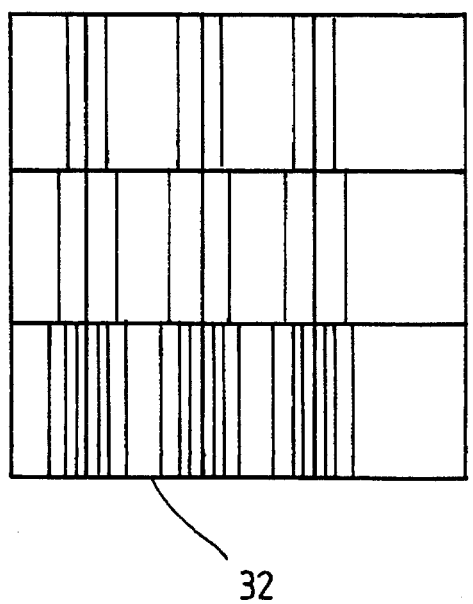
FIG. 8 is a diagrammatic representation of a fourth embodiment of a substructure of the image plane.
Figure 9:
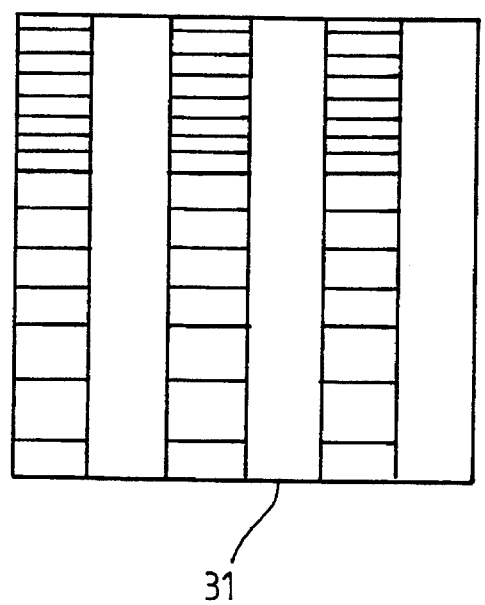
FIG. 9 is a diagrammatic representation of a fifth embodiment of a substructure of the image plane.

FIG. 6 represents an embodiment of a substructure according to the invention which has been obtained by appending the transparency of two rectangular grids having frequencies $v_1$ and $v_2$ in the vicinity of the resolution limit, the difference v of the two frequencies matching precisely the positional frequency fo of the fundamental grid.

The three grid combinations can also be provided on a single measuring structure.

Furthermore, it is also provided according to the invention that the fine structures 311 of a substructure 31 are arranged at right angles with respect to the ribs of the fundamental grid. In this case, too, it is provided that the substructure 31 consists of an arrangement of rectangular grids whose respective positional frequencies $v_1$, $v_2$, $v_3$ are close to the resolution limit. It is generally true that the rectangular grids are preferably situated at equal distances with respect to the width of the ribs and slots. According to the invention, it is likewise provided that the substructures are designed as optically homogeneous, i.e. non-structured, covered or uncovered areas.

The process described for the specific use can likewise be applied in the case of several image points, involving, in addition to the image field centre, the corners of the image field, in particular. This means that it is possible, thanks to the invention, to determine and to correct the tilt of the plane having the sharpest image with respect to the optical axis or the wafer surface, respectively. In addition, it can also be used to determine the astigmatism of the projection system, by forming images of the image plane measuring structure for both identical coordinates and measuring them.

Further uses follow from the applications thereof to so-called technological layers. According to the invention it is provided to expose the measuring structures described above in, for example, the etching slots (so-called scribe lines). Furthermore, by using the invention and prior to the actual exposure of, for example, a production wafer, the focus setting is determined for which the optimum sharpness is achieved. At this optimum focus setting the actual mask content is then exposed onto the production wafer. Thus, in situ measurement and in situ correction of the wafer height for production wafers, i.e. the desired on-line monitoring and on-line correcting, is made possible.

We claim:

1. In an apparatus for forming an image, by means of projection radiation of a feature on a mask in a photosensitive layer on a substrate, is comprising a mask holder, a substrate holder in spaced relationship to said mask holder, projection lens means mounted between the mask holder and the substrate holder, and latent image detection means mounted in spaced relationship to said substrate holder for detecting an undeveloped image, formed by means of the projection light, of the mask feature in the photosensitive layer, wherein the latent-image detection device comprises alignment means including a source of non-actinic projection radiation for irradiating said substrate photosensitive layer, intended for aligning, via the projection lens system, the mask pattern with respect to the substrate and is designed for detecting the measure of coincidence of a mask alignment feature and a substrate alignment feature, which alignment device is nonactinic radiation-sensitive detection means and means for detecting the nonactinic radiation reflected from said substrate photosensitive layer and producing electrical signal indicative of the amplitude of the radiation incident on the nonactinic radiation-sensitive detection means reflected from an area of the photosensitive layer onto which there is projected an image of the mask feature, the improvement wherein said mask feature is a first feature having a spatial frequency which is approximately equal to the useful resolving power of the projection lens means and considerably greater than the resolving power of the alignment means, and said mask has a second feature disposed between said substrate holder and said detection means for superimposition upon an aerial image of said first feature reflected from said photoresistive layer.

2. Apparatus according to claim 1, wherein the second mask feature comprises a grid having a frequency less than the resolution of the projection lens means and the first feature comprises two superimposed grids one of said superimposed grids having a frequency equal to the frequency of the grid of said second feature and the other of said superimposed grids having a frequency approximately equal to the resolution power of the projection lens means for actninic light.

3. Apparatus according to claim 2, wherein the alignment means comprises a first-order diaphragm mounted between the mask holder and substrate holder, which transmits, to the radiation-sensitive detection means, only radiation deflected in the first order.

4. Apparatus according to claim 1, comprising means for moving the image plane of the projection lens means with respect to the photosensitive layer to a plurality of positions for forming an image of the mask first feature in the substrate at each of said positions, the moving means being operatively connected to and synchronized with the electronic signal processing means, said electronic signal processing means producing a signal which is representative of the contrast of the image of the mask feature at each of the positions, one of the signals having a magnitude which represents the optimum image plane position of the projection lens means relative to the substrate.

5. Apparatus according to claim 1, comprising means for varying the energy of the projection radiation, over a plurality of intensities for forming an image of the mask first feature in the photosensitive layer, the varying means being operatively connected to and synchronized with the electronic signal processing means, the electronic signal processing means producing a signal which is representative of the contrast of the image of the mask feature at each of the intensities, one of the signals having a magnitude which represents the optimum intensity of the radiation energy.

6. Apparatus according to claim 1, wherein the first mask feature comprises a plurality of substructures.

7. Apparatus according to claim 6, wherein said mask first feature comprises a grid.

8. Apparatus according to claim 6, wherein each of said substructures comprises a plurality of subfigures.

9. Apparatus according to claim 8, wherein said plurality of subfigures is arranged periodically.

10. Apparatus according to claim 8, wherein each of said subfigures comprises a plurality of fine figures, each of the fine figures having a dimension on the order of the minimum resolution of the projection lens means.

11. Apparatus according to claim 10, further comprising means for moving the substrate after a first radiation by said source of radiation, said source of radiation producing a second radiation of said substrate after said movement thereof, wherein the distribution of the fine figures is such that the second radiation incident thereon is diffracted thereby so that at least part of the diffracted radiation is sensed by said detection means for determining the intensity of the diffracted radiation.

12. Apparatus according to claim 6, wherein the surface of the substructures comprises two parallel rectangular grids having positional frequencies $v_1$ and $v_2$, respectively.

13. Apparatus according to claim 12, wherein said positional frequencies $v_1$ and $v_2$ are of the order of magnitude of the limit positional frequency resolvable by the projection lens means, and their difference corresponds to a fundamental positional frequency of the fundamental grid.

14. Apparatus according to claim 6, wherein said subfigures comprise alternating draughtboard-shaped and rectangular grid figures having dimensions within the range of the resolution limit of the projection lens means.

15. Apparatus according to claim 6, wherein at least one of the substructures is transparent or opaque.

16. Apparatus according to claim 6, wherein said at least one of the substructures is on the top surface of the substrate.

17. A method of forming an image of a mask pattern in a photosensitive layer on a substrate, in which a mask having at least one mask feature is disposed above the photosensitive layer, comprising forming a latent image of the mask feature in the photosensitive layer by a projection lens means exposing a portion of the photosensitive layer to radiation having a first wavelength, moving the exposed portion of the photosensitive layer into the path of a beam of radiation of a second wavelength to which the photosensitive layer is insensitive, detecting the latent image of the mask feature in the photosensitive layer by means of a measuring means which produces a signal in response thereto, comparing an instantaneous value of an image parameter represented by the signal produced by the measuring means in response to the detection of the latent image of the mask feature with a desired value of said parameter, setting the image parameter, and forming an image of the mask pattern on at least one position in the photosensitive layer, the mask feature having a spatial frequency which is approximately equal to the useful resolving power of the projection lens means and considerably greater than the resolving power of the measuring means, the amplitude of the measuring means signal being a function of the contrast of the latent image.

18. A method according to claim 17, wherein a plurality of images of the mask feature are formed in succession, the position of the image plane of the projection lens means with respect to the photosensitive layer is altered and the substrate is moved in its own plane before formation of each successive image, and an optimum position of the image plane of the projection lens means with respect to the photosensitive layer is determined as a function of a characteristic of the images.

19. A method according to claim 17, wherein a plurality of images of the mask feature are formed in succession, the projection radiation energy is set to a different value and the substrate is displaced in its own plane before formation of each successive image, and an optimum projection radiation energy intensity is determined as a function of a characteristic of the plurality of images.

* * * * *